United States Patent [19]

Nakayama et al.

[11] Patent Number: 4,611,135
[45] Date of Patent: Sep. 9, 1986

[54] ANALOG SWITCH CIRCUIT AND SIGNAL ATTENUATOR EMPLOYING AN ANALOG SWITCH CIRCUIT

[75] Inventors: Yoshio Nakayama, Menuma; Fuminori Abe; Naofumi Nagasawa, both of Ooizumi, all of Japan

[73] Assignees: Sanyo Electric Co., Ltd.; Tokyo Sanyo Electric Co., Ltd., both of Japan

[21] Appl. No.: 531,178

[22] Filed: Sep. 9, 1983

[30] Foreign Application Priority Data

Sep. 13, 1982 [JP] Japan .................................. 57-160026
Sep. 13, 1982 [JP] Japan .................................. 57-160028

[51] Int. Cl.⁴ .................... H03K 17/16; H03K 17/687
[52] U.S. Cl. .................................. 307/572; 307/243; 307/585; 333/81 R
[58] Field of Search ............... 307/572, 576, 585, 242, 307/243; 333/81 R

[56] References Cited

U.S. PATENT DOCUMENTS 4,228,367 10/1980 Brown .................................. 307/572
4,473,761 9/1984 Peterson .............................. 307/585

Primary Examiner—John Zazworsky
Attorney, Agent, or Firm—Darby & Darby

[57] ABSTRACT

An analog switch circuit comprises a first transfer gate (20) and a second transfer gate (23). The first transfer gate comprise first P-type and N-type field-effect transistors (21) and (22) having first electrodes thereof commonly connected through an output terminal (5) to a load (6) and second electrodes thereof commonly connected through an input terminal (4) to an input signal source (7) of an impedance lower than that of the load. The second transfer gate comprises second P-type and N-type field-effect transistors (24) and (25) of a gate size smaller than that of the respective transistors constituting the first transfer gate having the first and second electrodes connected in parallel with the first and second electrodes of the first P-type and N-type transistors, respectively. The second transfer gate is first turned on and then the first transfer gate is turned on, whereby a switching noise on the occasion of turning on of the first transfer gate is bypassed through the second transfer gate to the input signal source.

8 Claims, 6 Drawing Figures

ANALOG SWITCH CIRCUIT AND SIGNAL ATTENUATOR EMPLOYING AN ANALOG SWITCH CIRCUIT

BACKGROUND OF THE INVENTION

1. Field of the Invention

The present invention relates to an analog switch circuit and signal attenuation employing an analog switch circuit. More specifically, the present invention relates to prevention of a switching noise in an analog switch circuit comprised in a signal attenuator for use in an audio apparatus.

2. Description of the Prior Art

FIG. 1 is a schematic diagram of an analog switch circuit which constitutes the background of the invention. Referring to FIG. 1, a transfer gate 1 comprises P-type and N-type insulated gate field-effect transistors 2 and 3. Such transistors are hereinafter referred to simply as transistors. First electrodes of the respective transistors 2 and 3 are commonly connected to an output terminal 5 and second electrodes thereof are also commonly connected to an input terminal 4. A load 6 is connected to the output terminal 5 and an input signal source 7 of an impedance lower than that of the load 6 is connected to the input terminal 4. A control signal obtained from a control input terminal 8 is applied to a gate of the N-type transistor 3 serving as a third electrode thereof and a control signal is applied, after inversion by inverter 9, to a gate of the P-type transistor 2.

When a control signal of the high level is applied to the control signal input terminal 8, the N-type transistor 3 is responsive to the control signal of the high level to be rendered conductive and the P-type transistor is responsive to the control signal of the low level obtained through inversion by the inverter 9 to be rendered conductive. In such analog signal as shown in FIG. 1, it is necessary to select the ON resistance of the transfer gate 1 to be as small as possible. To that end, it is necessary to make the gates of the P-type and N-type transistors 2 and 3 constituting the transfer gate 1 large sized as compared with those of general transistors. However, an increased size of the gate of a transistor accordingly increases a gate/source capacitance and a gate/drain capacitance and as a result such conventional P-type and N-type transistors 2 and 3 involved a disadvantage that a voltage change at gates on the occasion of turning on or off of the transfer gate 1 is leaked to the output through such capacitances, with the result that a switching noise appears on the output side.

FIG. 2 is a block diagram specifically showing a signal attenuator employing such analog switch as shown in FIG. 1. Referring to FIG. 2, the signal attenuator comprises a plurality of such analog switches 10a, 10b, ... 10g as shown in FIG. 1, the output ends of which are connected in parallel to an output terminal 13. A load 6 including an amplifier, a speaker and the like is connected to the output terminal 13. A bias voltage source 15 is connected to a bias voltage input terminal 14 and a resistance voltage dividing circuit 11 including a plurality of resistors 11a, 11b, ... 11f is connected between the above described bias voltage input terminal 14 and the input terminal 12. An input terminal of each of the analog switches 10a, 10b, ... 10g is connected to one end of each of the resistors 11a, 11b, ... 11f.

Meanwhile, in the case where the signal attenuator is employed as an electronic variable resistor serving as a volume cotroller, the respective resistance values are selected so as to provide the output for example of the A standard curve such that normally the resistor 11a has the maximum resistance value and the resistors 11b, 11c, ... 11f has the resistance values which are smaller in succession.

A press button key 16 is a key for enabling attenuation of a signal and it is adapted that upon each depression of the key 16 a clock pulse is generated from an oscillator 17 and is applied to a counter 18. The counter 18 serves to count the number of clock pulses and the count output is applied to a decoder 19. The decoder 19 serves to decode the count output of the counter 18 and decoded outputs $D_0, D_1, \ldots D_n$, are applied as control signals to the respective analog switches 10a, 10b, ... 10g. A selective one of the plurality of switches 10a through 10g is turned on in response to the presence of a respective one of control signals $D_0, D_1, \ldots D_n$. When the selected one of switches 10a through 10g is so turned on, the impedance of its main current path substantially decreases, thereby connecting the voltage developed at the associated common connection point between two of the resistors of resistive voltage divider 11 and the turned-on switch to terminal 13, as an output Voltage $V_0$.

In the above described signal attenuator shown in FIG. 2, the analog switch 10g has one end of its main current path connected directly, that is by a relatively low resistance conductor compared to the resistance of any one of resistors 11a through 11f. One end of resistive circuit 11 also is connected to bias voltage input terminal 14. Accordingly, it is necessary to make small the ON resistance of the analog switch 10g in order to decrease crosstalk between switch 10g and the other switches 10a through 10f. Accordingly, the gate size of the P-type and N-type transistors constituting the analog switch 10g need be of a size larger than the gate size of the transistors constituting the other analog switches 10a, 10b, ... 10f. However, as the gates of the transistors are made larger, the gate/source capacitance and the gate/drain capacitance accordingly becomes larger in the same manner as described previously in conjunction with FIG. 1 and therefore a voltage change at the gate is leaked through such capacitances to the output on the occasion of switching of the analog switch, with the resultant disadvantage that a switching noise appears on the output side.

SUMMARY OF THE INVENTION

Accordingly, a principal object of the present invention is to provide a novel analog switch circuit capable of transferring an analog signal to an output terminal without distortion by considerably decreasing a switching noise.

According to the present invention, first P-type and N-type field-effect transistors constitute a first transfer gate, wherein the first electrodes of the respective field-effect transistors are commonly connected through an output terminal to a load and second electrodes of the respective field-effect transistors are commonly connected through an input terminal to an input signal source of an impedance lower than that of the load; and second P-type and N-type field-effect transistors of a size smaller than the respective field-effect transistors constituting the first transfer gate constitute a second transfer gate, wherein the first and second electrodes of these second P-type and N-type field-effect transistors are connected in parallel with the first and second electrodes of the first P-type field-effect transistor and N-type field-effect transistor, respectively. The second transfer gate is first turned on and then the first transfer gate is turned on whereby a switching noise on the occasion of turning on of the first transfer gate is by-passed through the second transfer gate to the input signal source.

Therefore, according to the present invention, if and when the second transfer gate means is turned on, little noise appears at the output due to a decreased size of the gate. In addition, since the second transfer gate means has been turned on when the first transfer gate means is turned on, any switching noise by the first transfer gate means does not appear at the output.

In a preferred embodiment of the present invention, a plurality of the first transfer gate means are provided in parallel and the outputs of the first transfer gate means are connected in parallel, while a plurality of resistors are connected in series between the input terminal and the bias voltage generating means and the input of each of the first transfer gate means is connected to one end of each of the resistors, and second transfer gate means having a gate size smaller than that of the first transfer gate means are connected in parallel with the first transfer gate means directly connected to the bias voltage generating means, whereupon, with the second transfer gate means is first turned on and then the first transfer gate means directly connected to the bias voltage generating means is turned on.

Thus, according to the preferred embodiment of the present invention, the second transfer gate means of the gate size smaller than that of the first transfer gate means are connected in parallel with the first transfer gate means directly connected to the bias voltage generating means. Since it is adapted such that the first transfer gate means is turned on after the second transfer gate means is first turned on whereby a switching noise on the occasion on turning on of the first transfer gate means is bypassed through the second transfer gate means to the input signal source, it becomes possible to employ a transfer gate of a large gate size i.e. of a small on resistance, by way of the first transfer gate means directly connected to the bias voltage generating means, whereby a crosstalk can be suppressed as much as possible. Accordingly, the inventive analog switch circuit can be advantageously utilized as a selector of a signal attenuator.

In another embodiment of the present invention, a constant current source is provided for supplying a constant current to the respective third electrodes of the P-type and N-type field-effect transistors comprised in the first and second transfer gate means. The gate capacitances of the respective transistors are charged by the constant current obtained from the constant current source. Since gate capacitances of the respective transistors included in the second transfer gate means are smaller than those of the transistors included in the first transfer gate means, the second transfer gate means can be turned on before the first transfer gate means are.

By implementing the embodiment such that the gate of the transistor constituting the transfer gate is controlled with a constant current, a voltage of a rectangular wave form abruptly changing is not supplied to the gate and the gate voltage is changed smoothly, with the resultant advantage that a switching noise is more prevented. The inventive analog switch circuit can be also applied in transfer of the digital signal.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
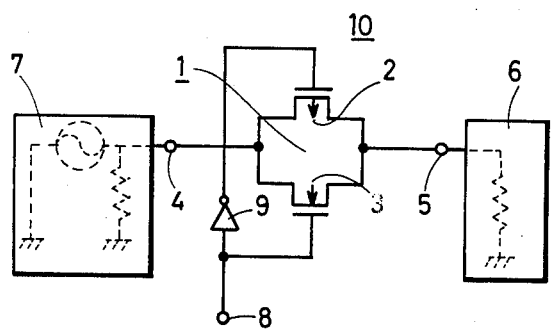
FIG. 1 is a block diagram of an analog switch which constitutes the background of the invention.
Figure 3:
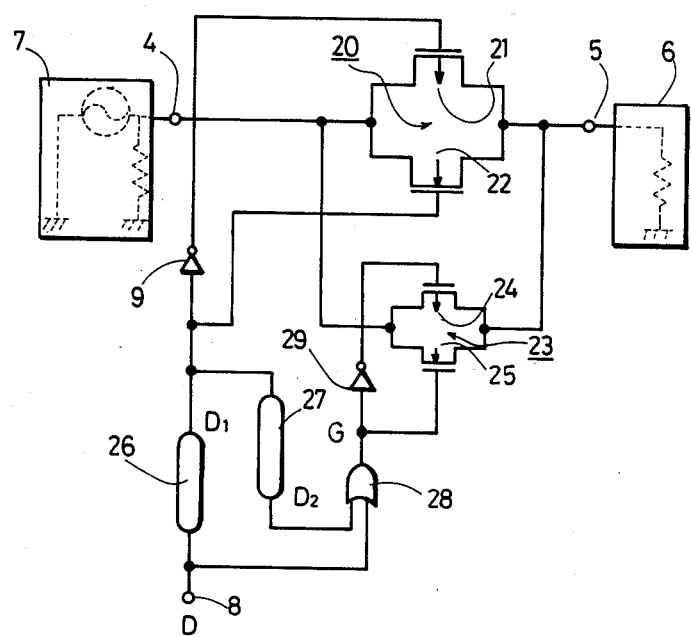
FIG. 3 is a schematic diagram of one embodiment of the present invention.

FIG. 3 is a schematic diagram of one embodiment of the present invention. First referring to FIG. 3, a specific structure of one embodiment of the present invention will be described. A first transfer gate 20 comprises P-type and N-type transistors 21 and 22. The respective first electrodes of the P-type and N-type transistors 21 and 22 are commonly connected to an output terminal 5 and the respective second electrodes thereof are commonly connected to an input terminal 4. A load 6 and an input signal source 7 having an impedance lower than that of the load 6 are connected to the output terminal 5 and the input terminal 4, respectively, in the same manner as that shown in FIG. 1 previously described. The second transfer gate 23 comprises P-type and N-type transistors 24 and 25. These P-type and N-type transistors 24 and 25 are of transistors having a gate size smaller than that of the P-type and N-type transistors 21 and 22 constituting the first transfer gate 20. The gates of the P-type and N-type transistors 24 and 25 are commonly connected to the output terminal 5 and the second electrodes thereof are also commonly connected to the input terminal 4.

A control signal applied to a control signal input terminal 8 is applied through an OR gate 28 to the gate of the N-type transistor 25 of the second transfer gate 23 and is also applied to the gate of the P-type transistor 24 after inversion thereof by an inverter 29. The control signal is also applied through a first delay circuit 26 to the gate of the N-type transistor 22 constituting the first transfer gate 20 and is also applied to the gate of the P-type transistor 21 after inversion thereof by the inverter 9. The control gate as delayed by the first delay circuit 26 is applied to the OR gate 28 through a second delay circuit 27. The above described first delay circuit 26 is provided for delaying the signal by a predetermined time period for the purpose of turning on the first transfer gate 20 after the second transfer gate 23 is turned on, when the control signal turns from the low level to the high level. The second delay circuit 27 is provided for turning off the first transfer gate 20, with the second transfer gate 23 kept turned on, when the control signal turns from the high level to the low level.

Now the operation of the embodiment shown in FIG. 3 will be described. When the control signal D rises from the low level to the high level, the respective gates of the N-type and P-type transistors 22 and 21 of the first transfer gate 20 are supplied with the control signal $D_1$ delayed by the first delay circuit 26 and an inversion signal thereof, respectively, and therefore the first transfer gate 20 is not turned on immediately. However, the respective gates of the N-type and P-type transistors 25 and 24 of the second transfer gate 23 connected in parallel with the first transfer gate 20 are instantaneously supplied with the control signal D after passage of the OR gate 28 and an inversion of the control signal by the inverter 20 and, therefore, the second transfer gate 23 is immediately turned on. Since the gate size of the second transfer gate 23 is small, according to the present invention, only a small switching noise occurs at the time of turning on. Thereafter the control signal as delayed by the first delay circuit 26 becomes the high level and the same is applied to the gate of the N-type transistor 22 of the first transfer gate 20 and the control signal thereof inverted by the inverter 9 is supplied to the gate of the P-type transistor 21 and, therefore, the first transfer gate 20 is turned on. Although a large switching noise occurs from the first transfer gate 20 at that time, the second transfer gate 23 has already been turned on. In addition, since the input signal source 7 is of an impedance lower than that of the load 6 connected to the output terminal 5, a switching noise which occurred is absorbed by the input side through the second transfer gate 23 connected in parallel with the first transfer gate 20. Therefore, little switching noise appears on the part of the load 6.

When the control signal turns from the high level to the low level, the signal $D_1$ becomes the low level after the lapse of a predetermined delay time by the first delay circuit 26, whereby the first transfer gate 20 is about to be turned off. However, since the delay signal $D_2$ is still of the high level and the output G of the OR gate 28 is also of the high level, the second transfer gate 23 remains in the on-state. Therefore, a large switching noise occurs at the time when the first transfer gate 20 is turned off; however, such switching noise is absorbed by the input side through the second transfer gate 23, in the same manner as that on the occasion of turning on. Therefore, no switching noise appears on the part of the load 6. Since a signal $D_2$ becomes the low level signal after the lapse of the predetermined delay time period by the second delay circuit 27 thereafter, the second transfer gate 23 is turned off.

As described in the foregoing, according to the embodiment, since the first transfer gate 20 is turned on while the second transfer gate 23 is kept turned on and the first transfer gate 20 is turned off while the second transfer gate 23 is kept turned on, little switching noise appears on the part of the load 6 in either at the time of turning on or at the time of turning off.

Figure 4:
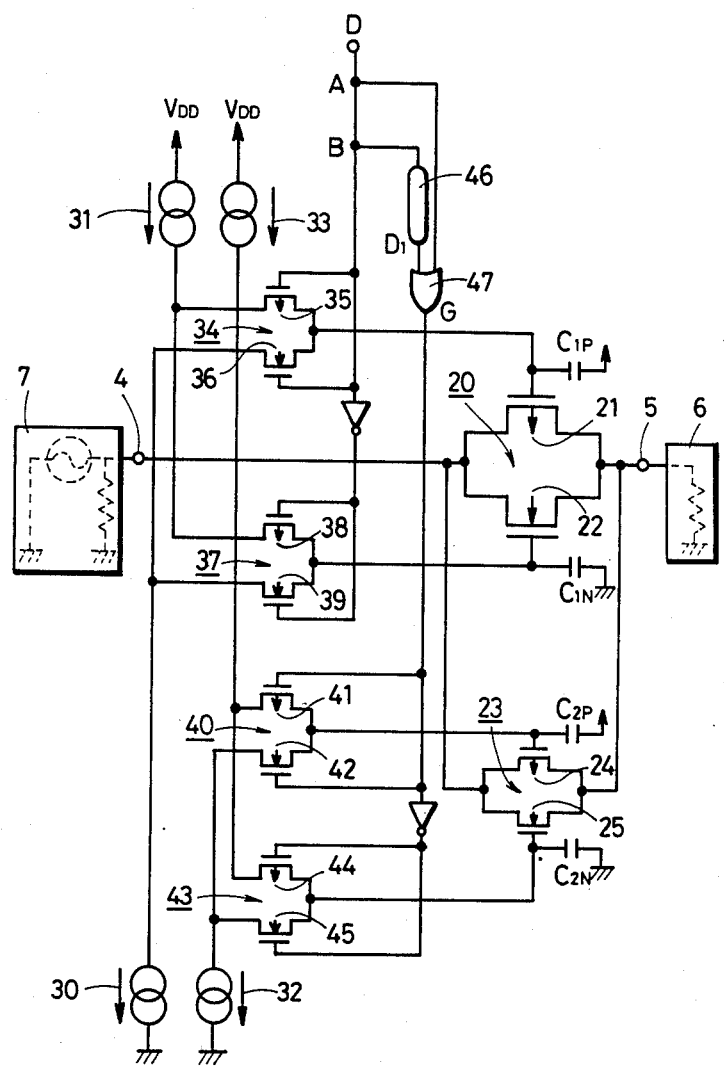
FIG. 4 is a schematic diagram of another embodiment of the present invention.

FIG. 4 is a schematic diagram of another embodiment of the present invention. The embodiment shown in FIG. 4 is adapted such that the gates of the P-type and N-type transistors 21, 22, 24 and 25 constituting the first and second transfer gates 20 and 23, respectively, previously shown in FIG. 3, are controlled with a constant current. First a structural feature of the same will be described. In the same manner as depicted in conjunction with FIG. 3, the second transfer gate 23 of a gate size smaller than that of the first transfer gate 20 is connected in parallel with the first transfer gate 20 for transferring an analog signal from the input signal source 7 to the load 6. Constant current sources 30, 31, 32 and 33 are provided for supplying a constant current to each of the gates of the respective transistors 21, 22, 24 and 25 of the first and second transfer gates 20 and 23. Selection switches 34, 37, 40 and 43 are provided for connecting the P-type and N-type transistors 21, 22, 24 and 25 constituting the first transfer gate 20 and the second transfer gate 23 to the constant current sources 30, 31, 32 and 33, respectively, in response to the control signal D. These selection switches 34, 37, 40 and 43 are formed with P-type transistors 35, 38, 41 and 44 and N-type transistors 36, 39, 42 and 45, respectively. The delay circuit 46 and the OR gate 47 correspond to the delay circuit 27 and the OR gate 28, respectively, shown in FIG. 3, and serve to turn off the first transfer gate 20, while the second transfer gate 23 is kept turned on.

Now an operation thereof will be described. Meanwhile, in the following description it is assumed that constant currents obtained from the respective constant current sources 30, 31, 32 and 33 are the same. If and when the control signal D turns from the low level to the high level, the N-type transistors 36 and 42 of the selection switches 34 and 40 and the P-type transistors 38 and 44 of the selection switches 37 and 43 are turned on. Therefore, the respective gates of the P-type and N-type transistors 21 and 22 of the first transfer gate 20 are connected to the constant current sources 30 and 31, respectively. The respective gates of the P-type and N-type transistors 24 and 25 of the second transfer gate 23 are connected to the constant current sources 32 and 33. Therefore, capacitances between the gates of the P-type and N-type transistors 21 and 22 of the first transfer gate 20 and the substrate, i.e. gate capacitances $C_{1P}$ and $C_{1N}$, and gate capacitances $C_{2P}$ and $C_{2N}$ of the P-type and N-type transistors 24 and 25 of the second transfer gate 23 start being charged. However, since the second transfer gate 23 has the gate size smaller than that of the first transfer gate 20, the gate capacitances $C_{2P}$ and $C_{2N}$ have capacitance values smaller than those of the gate capacitances $C_{1P}$ and $C_{1N}$ of the first transfer gate 20. Accordingly, the second transfer gate 23 of the smaller gate size is turned on before the first transfer gate 20 is turned on. Therefore, in the same manner as that described in conjunction with the embodiment shown in FIG. 3, the switching noise at the time of turning on is absorbed on the input side through the second transfer gate 23 and does not appear on the part of the load 6.

When the control signal D turns from the high level to the low level, the P-type and N-type transistors 35 and 39 of the selection switches 34 and 37 are immediately turned on and the respective gates of the P-type and N-type transistors 21 and 22 of the first transfer gate 20 are connected to the constant current sources 31 and 30, respectively. Therefore, the gate capacitances $C_{1P}$ and $C_{1N}$ of the first transfer gate 20 start discharging the electric charges stored therein. However, since the delay signal $D_1$ by the delay circuit 46 remains still the high level and the output signal G from the OR gate 47 is also the high level even after the control signal D turns from the high level to the low level, the second transfer gate 23 remains in the on-state. Therefore, the electric charges stored in the gate capacitances $C_{1P}$ and $C_{1N}$ of the first transfer gate 20 are further discharged and at the time when the first transfer gate 20 is turned off, a large switching noise occurs; however, in the same manner as that on the occasion of turning on, the said switching noise is absorbed on the input side through the second transfer gate 23. Therefore, no switching noise appears on the side of the load 6.

Since the delay signal $D_1$ becomes the low level thereafter, the output signal G of the OR gate 47 also becomes the low level and the respective gates of the P-type and N-type transistors 24 and 25 constituting the second transfer gate 23 are connected through the P-type and N-type transistors 41 and 45 of the selection switches 40 and 43 to the constant current sources 33 and 32, respectively. The electric charges stored in the respective gate capacitances $C_{2P}$ and $C_{2N}$ of the second transfer gate 23 are discharged and the second transfer gate 23 is turned off.

In the embodiment shown in FIG. 4, no voltage of a rectangular shape abruptly changing is applied to the gates constituting the first transfer gate 20 and the second transfer gate 23 and hence a gate voltage changes smoothly, with the result that the same is more effective in preventing the switching noise.

Although the constant current values of the constant current sources 30, 31, 32 and 33 were selected to be the same in the foregoing description, these need not be necessarily the same. For example, in the case where the ratio of the gate sizes of the first transfer gate 20 and the second transfer gate 23 is 10:1 and the ratio of the currents of the constant current sources 30 and 32 and the ratio of the currents of the constant current sources 31 and 33 are selected to be substantially the same as the ratio of the gate sizes and hence to be 10:1, then a circuit similar to the first delay circuit 26 shown in FIG. 3 may be inserted between the points A and B in FIG. 4.

Figure 2:
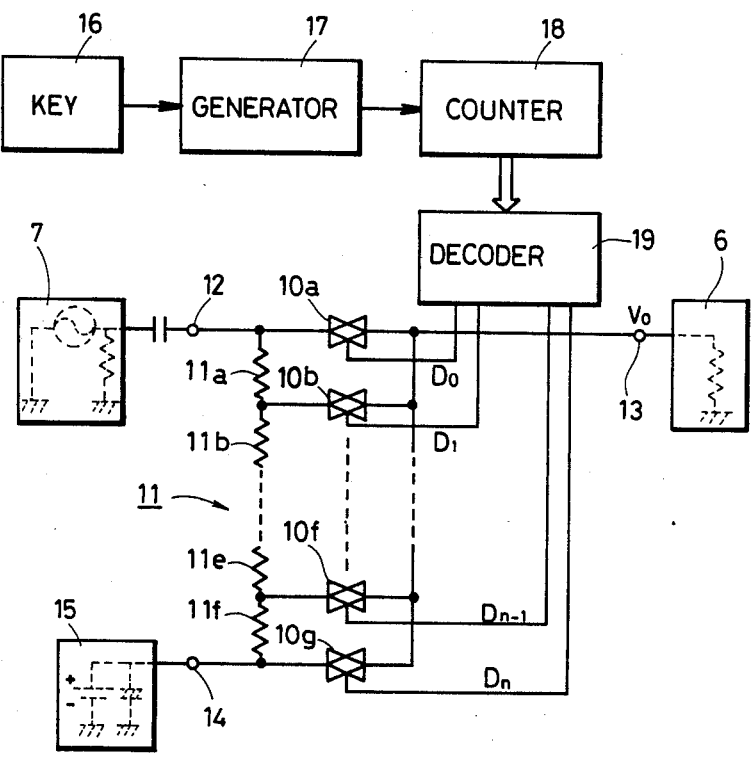
FIG. 2 is a block diagram specifically showing a signal attenuator employing the analog switch shown in FIG. 1.
Figure 5:
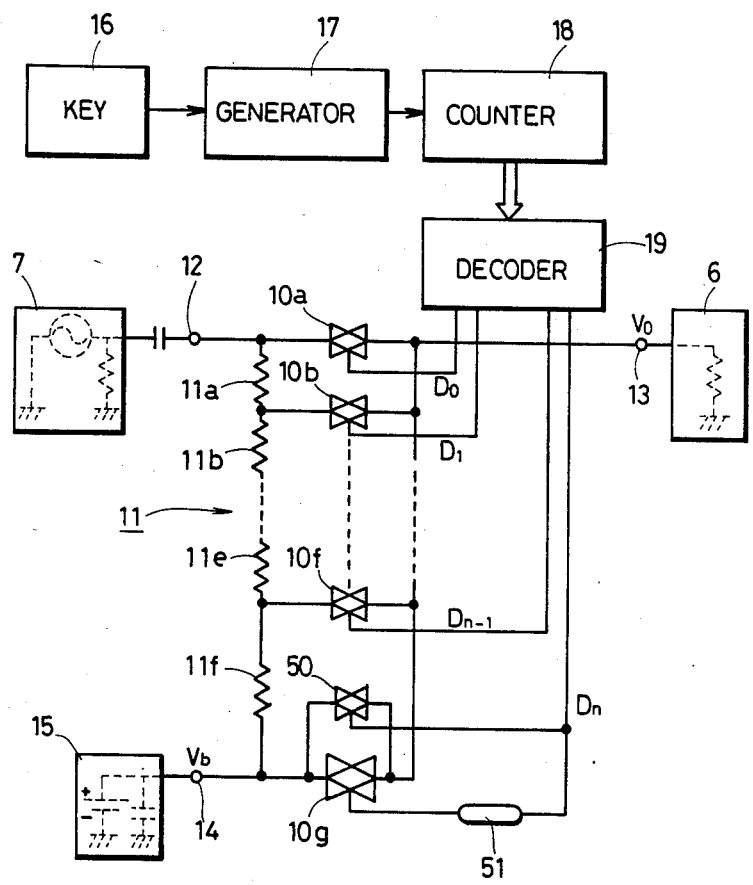
FIG. 5 is a block diagram specifically showing the signal attenuator employing an analog switch circuit of one embodiment of the present invention.

FIG. 5 is a block diagram showing more specifically a signal attenuator employing the analog switch circuit in accordance with one embodiment of the present invention. The embodiment shown in FIG. 5 is substantially the same as that shown in FIG. 2, except for the following respects. More specifically, the analog switch 50 of a gate size smaller than that of the analog switch 10g is connected in parallel with the analog switch 10g having the input terminal directly connected to the bias voltage input terminal 14. The analog switch 50 comprises the P-type and N-type transistors in combination in the same manner as that of the second transfer gate 23 previously shown in FIG. 3 and inverter for an inversion control signal. Although the analog switches 10a, 10b, ... 10f are supplied with the outputs $D_0, D_1, ... D_{n-1}$ from the decoder 19 as a control signal in the same manner as that described in conjunction with FIG. 2, the analog switch 10g is supplied with a signal obtained by delaying the control signal $D_n$ by the delay circuit 51 and the analog switch 50 of a smaller size connected in parallel is supplied with the decode signal $D_n$.

The gate size of the transistor constituting the analog switch 10g shown in FIG. 5 is of a size larger than the gate sizes of the transistors constituting the other analog switches 10a, 10b, ... 10f.

Now the operation will be described. Assuming that the decoded signals $D_0, D_1, ... D_{n-1}, D_n$ from the decoder 19 turns from "00 ... 10" to "00 ... 01", then the delay signal of the decoded signal $D_n$ is supplied to the analog switch 10g and, therefore, the same is not turned on immediately and the analog switch 50 of a smaller gate size is first turned on. At the time of turning on, only a small switching noise occurs due to the fact that the analog switch 50 is of a small gate size. When the delay signal turns to "1" thereafter and the analog switch 10g is turned on, a larger switching noise occurs; however, the analog switch 50 of a smaller gate size has already been turned on. In addition, since the bias voltage source 15 is of a lower impedance as compared with the load 6 connected to the signal output terminal 13, an occurring switching noise is bypassed to the side of the bias voltage source 15 through the analog switch 50 of a smaller gate size, with the result that little switching noise appears on the side of the load 6. Thus, it is possible to make little switching noise appear at the output at the time when the analog switch 50 is turned on.

If and when the decoded signals $D_0, D_1, ... D_{n-1}, D_n$ turn from "00 ... 01" to "00 ... 10", the analog switch 50 of a smaller gate size is turned off earlier than the analog switch 10g. However, since the analog switch 10f of the preceding stage is turned on and resistor 11f is selected smaller resistance value before the analog switch 10g is turned off, the switching noise at the time of turning off of the analog switch 10g is bypassed to the side of the bias voltage source 15 through the analog switch 10f and the resistor 11f of the preceding stage. Accordingly, little switching noise appears on the side of the output.

Meanwhile, the voltage Vb of the bias voltage source may be zero volts, i.e., equals to ground potential.

Figure 6:
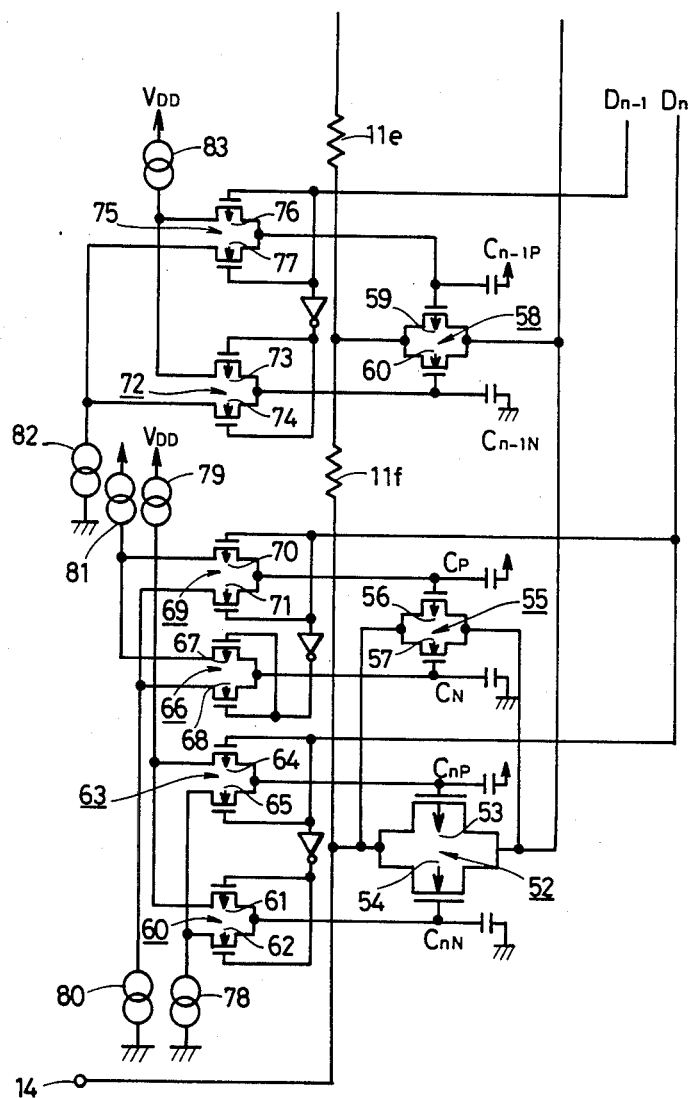
FIG. 6 is a schematic diagram showing a major portion of the signal attenuator employing the analog switch circuit of one embodiment of the present invention.

FIG. 6 is a schematic diagram showing a major portion of a signal attenuator employing the analog switch circuits in accordance with one embodiment of the present invention. FIG. 6 specifically shows a portion corresponding to the analog switches 10f and 10g shown in FIG. 5 and comprises constant current sources 78 to 83 for turning on or off the transfer gate by controlling the gates thereof with the constant currents, in the same manner as that of the embodiment previously shown in FIG. 4. More specifically, the first transfer gate 52 corresponding to the analog switch 10g comprises P-type and N-type transistors 53 and 54 having the input terminals directly connected to the bias voltage input terminal 14 and the output terminal connected to the signal output terminal, not shown. The second transfer gate 55 corresponding to the analog switch 50 comprises P-type and N-type transistors 56 and 57 having the gate size selected to be smaller than that of the first transfer gate 52. The second transfer gate 55 is connected in parallel with the first transfer gate 52. The transfer gate 58 corresponds to the analog switch 10f and comprises the P-type and N-type transistors 59 and 60. The constant current sources 78, 79, 80 and 81 are provided for supplying constant currents in accordance with the control signal Dn to the first and second transfer gates 52 and 55. To that end, selection switches 60, 63, 66 and 69 are provided for supplying to the first and second transfer gates 52 and 59 constant currents in response to the control signal Dn. The respective selection switches 60, 63, 66 and 69 comprises P-type transistors 61, 64, 67 and 70 and N-type transistors 62, 65, 68 and 71. The constant current sources 82 and 83 are provided for supplying constant currents to the transfer gate 58. To that end, selection switches 72 and 75 are provided for supplying to the transfer gate 58 from the constant current sources 82 and 83 the constant currents in response to the control signal $D_{n-1}$. The selection switches 72 and 75 comprise the P-type transistors 73 and 76 and N-type transistors 74 and 77.

Meanwhile, the other analog switches 10a, 10b... are also to be connected to the constant current source in the same manner as that of the analog switch 10f.

Now the operation of the above described embodiment will be described. If and when the control signals $D_0, D_1, \ldots D_{n-1}, D_n$ from the decoder turn from "00 ... 10" to "00 ... 01", the P-type transistor 61 of the selection switch 60 and the P-type transistor 67 of the selection switch 66 and the N-type transistor 65 of the selection switch 63 and the N-type transistor 71 of the selection switch 69 are turned on. As a result, the respective gates of the P-type transistor 53 of the first transfer gate 52 and the P-type transistor 56 of the second transfer gate 55 are connected to the constant current sources 78 and 80. Then the capacitances between the respective gates of the P-type transistors 53 and 56 and the substrate, i.e. the gate capacitances $C_{np}$ and $C_p$, start being charged. The respective gates of the N-type transistor 54 of the first transfer gate 52 and the N-type transistor 57 of the second transfer gate 55 are connected to the constant current sources 79 and 81, respectively, and the gate capacitances $C_n$ and $C_N$ also start being charged. However, since the gate size of the second transfer gate 55 is smaller than the size of the first transfer gate 52, the gate capacitances $C_p$ and $C_N$ are smaller than the capacitances of the gate capacitances $C_{np}$ and $C_{nN}$, with the result that the transfer gate 55 of a smaller gate size is turned on earlier than the first transfer gate 52. Therefore, a large switching noise occurring when the first transfer gate 52 is bypassed from the bias voltage input terminal 14 to the bias voltage source through the second transfer gate 55 and does not appear on the output side.

When the control signals $D_0, D_1, \ldots D_{n-1}, D_n$ from the decoder turns from "00 ... 01" to "00 ... 10", the P-type transistor 73 and the N-type transistor 77 of the selection switches 72 and 75 are turned on and the P-type transistor 59 and the N-type transistor 60 of the transfer gate 58 of the preceding stage are connected to the constant current sources 82 and 83, respectively. As a result, the gate capacitances $C_{n-1\ p}$ and $D_{n-1\ N}$ start being charged. On the other hand, the P-type transistor 53 of the first transfer gate 52 and the P-type transistor 56 of the second transfer gate 55 are connected to the constant current sources 79 and 81, respectively, and the N-type transistor 54 of the first transfer gate 52 and the N-type transistor 57 of the second transfer gate 55 are connected to the constant current sources 78 and 80, respectively. As a result, the electric charges stored in the gate capacitances $C_{np}$ and $C_p$, $C_{nN}$ and $C_N$ start being discharged, when the transfer gate 55 of a smaller gate size is first turned off. However, since the capacitances of the gate capacitances $C_{n-1\ p}$ and $C_{n-1\ N}$ are smaller than the capacitances of the gate capacitances $C_{np}$ and $C_{nN}$, the second transfer gate 55 is turned off after the transfer gate 58 of the preceding stage is turned on. Therefore, the switching noise at the time when the first transfer gate 52 is turned off is bypassed from the bias voltage input terminal 14 to the bias circuit through the transfer gate 58 and the resistor 11f of the preceding stage.

Although the above described embodiment was adapted such that the switching noise on the occasion of turning off is bypassed through the transfer gate 58 of the preceding stage, the embodiment may be adapted such that switching noise may be bypassed through the transfer gate 55 of a smaller size connected in parallel.

Meanwhile, the embodiment shown in FIG. 6 need not be adapted such that all of the constant current sources 78 to 83 may supply the same constant currents and the embodiment may be such that the delay circuit 51 for delaying the control signal Dn shown in FIG. 5 may be provided.

Furthermore, the embodiment may be adapted such that the transfer gates of a smaller gate size are connected in parallel with the transfer gates other than the transfer gate 52 having the input terminal directly connected to the bias voltage input terminal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog switch circuit, comprising:
   an output terminal connected to a load having a given impedance,
   an input terminal connected to an input signal source having an impedance lower than the impedance of said load,
   a control signal input terminal receiving a control signal,
   first transfer gate means including a first P-type and a first N-type field-effect transistor, each having first, second, and third electrodes, each of said first electrodes being commonly connected to said output terminal, and each of said second electrodes being commonly connected to said input terminal,
   second transfer gate means including a second P-type and a second N-type field-effect transistor, each including first, second, and third electrodes, each of said second transfer gate means first electrodes being commonly connected and being connected in parallel with said commonly connected first electrodes of said first transfer gate means, each of said second electrodes of said second transfer gate means being commonly connected and being connected in parallel with said commonly connected second electrodes of said first transfer gate means, said second P-type and N-type field effect transistors each having a gate size smaller than that of said first P-type and N-type field effect transistors included in said first transfer gate means, and
   control means responsive to a control signal supplied to said control signal input terminal for applying a signal to each one of said third electrodes of said second transfer gate means so that said second transfer gate means is first turned on and for applying thereafter a signal to each one of said third electrodes of said first tranfer gate means so that said first gate means is then turned on.

2. An analog switch circuit in accordance with claim 1, which further comprises
   first and second constant current source means, each providing a constant current, and wherein
   said control means includes means responsive to said control signal for supplying constant current from said first and second constant current source means to the third electrodes of said first and second transfer gate means, respectively.

3. An analog switch circuit in accordance with claim 1, wherein
   said control means comprises means responsive to a control signal applied to said control signal input terminal for turning off said first transfer gate means with said second transfer gate means kept turned on.

4. An analog switch circuit in accordance with claim 3, wherein
said control means comprises
delay means for allowing said control signal applied to said control signal input terminal to be delayed for a predetermined time period, and
means responsive to said control signal turning from a first logical state to a second logical state for turning on said second transfer gate means and responsive to said control signal turning from a second logical state to a first logical state for retaining said second transfer gate means in an on-state for said predetermined time period as a function of the output from said delay means.

5. A signal attenuator employing an analog switch circuit, comprising
an output terminal connected to a load having a given impedance,
an input terminal connected to an input signal source having an impedance lower than the impedance of said load,
bias voltage generating means for generating a bias voltage,
resistor voltage dividing means including a plurality of resistors connected in series between said input terminal and said bias voltage generating means,
first transfer gate means provided corresponding to each said resistor and each gate means including a first P-type and a first N-type field-effect transistor, each having first, second, and third electrodes, all of said first electrodes of said first transfer gate means being commonly connected to said output terminal and, each of said second electrodes of respective first transfer gate means being commonly connected to an input end of its corresponding resistor,
second transfer gate means including a second P-type and a second N-type field-effect transistor, each including first, second, and third electrodes, each of said first electrodes of said second transfer gate means being commonly connected to said output terminal, and each of said second electrodes of said second transfer gate means being commonly connected to said bias voltage generating means,
third transfer gate means including a third P-type and a third N-type field-effect transistor, each including first, second, and third electrodes, each of said first electrodes of said third transfer gate means being commonly connected and being connected in parallel with said first electrodes of said second transfer gate means, each of said second electrodes of said third transfer gate means being commonly connected and being connected in parallel with said second electrodes of said second transfer gate means, said third P-type and third N-type field-effect transistors each having a gate size smaller than that of said second P-type and second N-type field-effect transistors included in said second transfer gate means, and
control signal generating means for generating a plurality of control signals for turning on or off in succession each said first transfer gate means and said second transfer gate means,
control means responsive to a control signal supplied to a control signal input terminal for applyiong a signal to said third electrodes of said second transfer gate means so that said second transfer gate means is first turned on and for applying thereafter signals to said first transfer gate means so that said first transfer gate means are then turned on.

6. A signal attenuator in accordance with claim 5, wherein
said control means comprises means responsive to a control signal from said control signal generating means for turning off said second transfer gate means with said third transfer gate means kept turned on.

7. A signal attenuator in accordance with claim 5, which further comprises:
first and second constant current source means each providing a constant current, and wherein
said control means includes means responsive to said control signal for supplying constant current from said first and second constant current source means to the third electrodes of said first, second, and third transfer gate means, respectively.

8. A signal attenuator in accordance with claim 5, wherein
said control signal generating means comprises
a command key for commanding a switching operation of said first transfer gate means or said second transfer gate means,
pulse signal generating means responsive to said command from said command key for generating a pulse signal,
counting means for counting said pulse signal, and
a decoder for decoding the output from said count means for providing the decoded output as said control signal.

* * * * *